United States Patent [19]

Ballato et al.

[11] 4,409,711
[45] Oct. 18, 1983

[54] METHOD OF FABRICATING ACCELERATION RESISTANT CRYSTAL RESONATORS

[75] Inventors: Arthur Ballato, Long Branch; John R. Vig, Colts Neck, both of N.J.

[73] Assignee: The United States of America as represented by the Secretary of the Army, Washington, D.C.

[21] Appl. No.: 426,349

[22] Filed: Sep. 29, 1982

Related U.S. Application Data

[62] Division of Ser. No. 196,508, Oct. 14, 1980, Pat. No. 4,365,182.

[51] Int. Cl.$^3$ ............................................. H04R 17/00
[52] U.S. Cl. ................................................. 29/25.35
[58] Field of Search ............... 29/25.35; 310/331, 332, 310/315, 360, 339, 346, 348, 361, 366, 367, 368; 331/158, 175, 116 R; 368/159, 167; 156/623 Q; 73/382 R, DIG. 4, DIG. 10

[56] References Cited

U.S. PATENT DOCUMENTS

| | | | |
|---|---|---|---|
| 1,782,117 | 11/1930 | Cady | 310/366 |
| 2,472,179 | 6/1949 | Tibbetts | 310/331 |
| 3,129,346 | 4/1964 | White | 310/315 |
| 3,968,462 | 7/1976 | Coussot | 310/360 |
| 4,112,147 | 9/1978 | Thompson | 29/25.35 |
| 4,163,959 | 8/1979 | Dailing | 310/366 |
| 4,344,010 | 8/1982 | Vig et al. | 310/361 |

Primary Examiner—Carl E. Hall
Assistant Examiner—P. W. Echols
Attorney, Agent, or Firm—Robert P. Gibson; Jeremiah G. Murray; Roy E. Gordon

[57] ABSTRACT

An acceleration resistant crystal resonator is made from a single quartz plate that is optically twinned into a left-handed (LH) quartz portion and a right-handed (RH) quartz portion. According to the method, the optically twinned single quartz plate is formed into a resonator plate wherein the effective thickness of the (LH) portion is substantially the same as the effective thickness of the (RH) portion. The resonator plate is then mounted and bonded to the support structure of a crystal resonator enclosure. A pair of electrodes is then deposited onto the (LH) portion and a pair of electrodes deposited onto the (RH) portion. The thickness of the two pairs of electrodes is then adjusted so that the resonant frequency of the resonator on the (LH) portion is substantially the same as the resonant frequency of the resonator on the (RH) portion. The pairs of electrodes are then interconnected to each other and to an oscillator circuit so that in-phase vibration of the two portions is assured. The enclosure is then hermetically sealed.

10 Claims, 6 Drawing Figures

METHOD OF FABRICATING ACCELERATION RESISTANT CRYSTAL RESONATORS

The invention described herein may be manufactured, used, and licensed by or for the Government for governmental purposes without the payment to us of any royalty thereon.

This application is a division of application Ser. No. 196,508, filed Oct. 14, 1980 now U.S. Pat. No. 4,365,182.

This invention relates in general to a method of making acceleration resistant resonators and to the resonators so formed and in particular to a method of making acceleration resistant resonators from a single quartz plate that is optically twinned into a left-handed (LH) quartz portion and a right-handed (RH) quartz portion and to the resonators so formed.

This application is copending with U.S. patent application Ser. No. 086,504, now U.S. Pat. No. 4,344,010, filed Oct. 19, 1979 of Arthur Ballato and John R. Vig for "Acceleration Resistant Crystal Combinations" and assigned to a common assignee.

BACKGROUND OF THE INVENTION

As is commonly known, quartz crystals are used to control the frequency of electrical oscillators and in other circuits where an electrical resonant frequency is used. However, a problem with such crystals is that their natural resonant frequency changes with acceleration that may be applied to the crystal. The deleterious effects of such acceleration induced frequency shifts are well known by the designers of systems that require high precision frequency control.

One method of minimizing the acceleration induced frequency shifts is discussed in U.S. Pat. No. 4,344,010. In that application, it is shown that acceleration resistant resonators can be obtained by providing two crystals which are electrically coupled or mechanically coupled, or both electrically and mechanically coupled together. U.S. Pat. No. 4,344,010 further discloses that the acceleration sensitivity can be minimized by the use of two resonators, one of which is left-handed, and the other of which is right-handed; the crystallographic axes of which are aligned antiparallel.

Although the method of U.S. Pat. No. 4,344,010 minimizes the acceleration induced frequency shifts, implementation of the method as disclosed in U.S. Pat. No. 4,344,010 is complicated in that it requires two separate pieces of quartz that have to be individually fabricated in such a way that properties such as crystallographic orientation have to be properly matched. Moreover, the pieces in U.S. Pat. No. 4,344,010 are required to be aligned and mechanically joined together subsequent to fabrication.

SUMMARY OF THE INVENTION

The general object of this invention is to provide an improved resonator. A more particular object of the invention is to provide a method that will obviate the disadvantages of the U.S. Pat. No. 4,344,010 method.

It has now been found that the foregoing objectives can be attained by making acceleration resistant resonators from a single quartz plate that is optically twinned into a left-handed (LH) quartz portion and a right-handed (RH) quartz portion. According to the method, the optically twinned single quartz plate is formed into a resonator plate wherein the effective thickness of the (LH) portion is substantially the same as the effective thickness of the (RH) portion. The resonator plate is then mounted and bonded to the support structure of a crystal resonator enclosure. A pair of electrodes is then deposited into the (LH) portion and a pair of electrodes deposited onto the (RH) portion. The thicknesses of the two pairs of electrodes are then adjusted so that the resonant frequency of the resonator on the (LH) portion is substantially the same as the resonant frequency of the resonator on the (RH) portion. The pairs of electrodes are then interconnected to each other and to an oscillator circuit so that in-phase vibration of the two portions is assured. The enclosure is then hermetically sealed.

The optically twinned piece of quartz from which the resonator plate is formed may be natural quartz as found in nature, as mined, etc. It may also be artificially formed by selecting an (RH) quartz seed and an (LH) quartz seed of substantially the same crystallographic orientation, joining the two seeds at the edges, and using the twinned seed so formed in growing cultured quartz by art-established techniques. In the method of this invention, the use of the artificially formed optically twinned piece of quartz is preferred.

In forming the resonator plate from the optically twinned piece of quartz, the resonator plate can be made circular, square, rectangular, or in other polygonal shapes. The major faces of the plate can be made plano-plano, that is, the condition where the sides of the plate are flat and parallel. The major faces of the plate can also be formed in a plano-convex shape where one side of the plate is flat and the other side of the plate is contoured. In the latter instance, one convenient contour that can be used is a cylindrical contour when the plates are square or rectangular in shape. Then too, the resonator plate can be formed biconvex where both sides of the plate are contoured. In the method of this invention, the resonator plate that is rectangular and plano-convex is preferred.

The resonator plate is then mounted and bonded to the support structure of the crystal resonator enclosure using art-established techniques. The mounting structure may typically consist of 2 to 4 mounting clips.

A pair of electrodes is then deposited onto the (LH) portion of the resonator plate and a pair of electrodes deposited onto the (RH) portion of the resonator plate using vacuum deposition techniques. The arrangement of the pairs of electrodes will be more particularly illustrated in the discussion of the drawing.

The adjustment of the thickness of the two pairs of electrodes so that the resonant frequency of the resonator on the (LH) portion is substantially the same as the resonant frequency of the resonator on the (RH) portion can be accomplished by art-established deposition techniques.

The pairs of electrodes are then interconnected to each other and to an oscillator circuit so that in-phase vibration of the two portions is assured. The interconnection will be particularly illustrated in the discussion of the drawing.

An acceleration resistant crystal resonator is then obtained by hermetically sealing the enclosure using art-established techniques.

FIG. II shows a side view of the resonator plate of FIG. I.

FIG. III shows an interconnection in parallel of the pairs of electrodes of FIG. I to each other and to an oscillator circuit.

FIG. IV shows an interconnection in series of the pairs of electrodes of FIG. I to each other and to an oscillator circuit.

Figure 1:
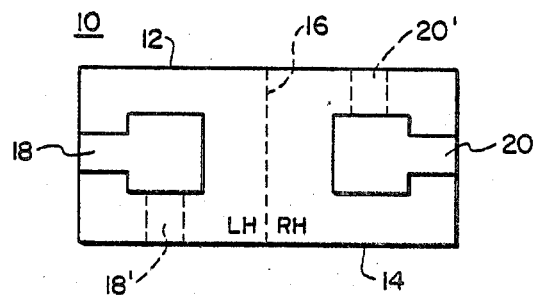
FIG. 1 shows a top view of a resonator plate composed of a single piece of twinned quartz approximately one-half of which is left-handed and approximately one-half of which is right-handed and in which a pair of electrodes has been deposited onto the (LH) portion and a pair of electrodes deposited onto the (RH) portion.
Figure 2:
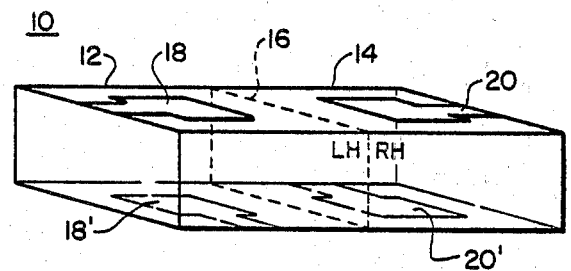
Figure 3:
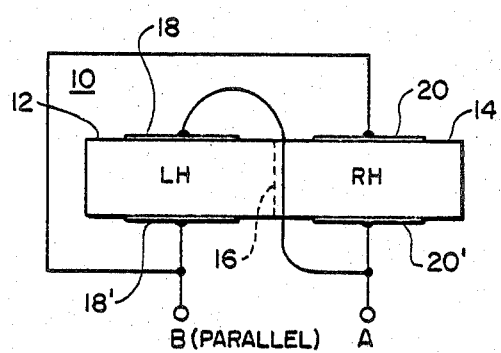
Figure 4:
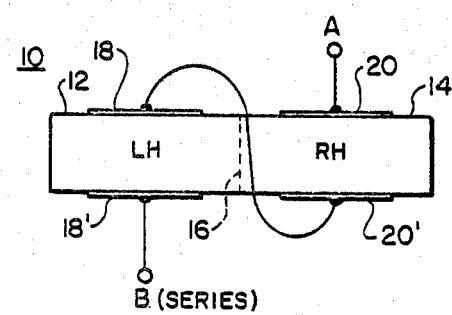
Figure 5:
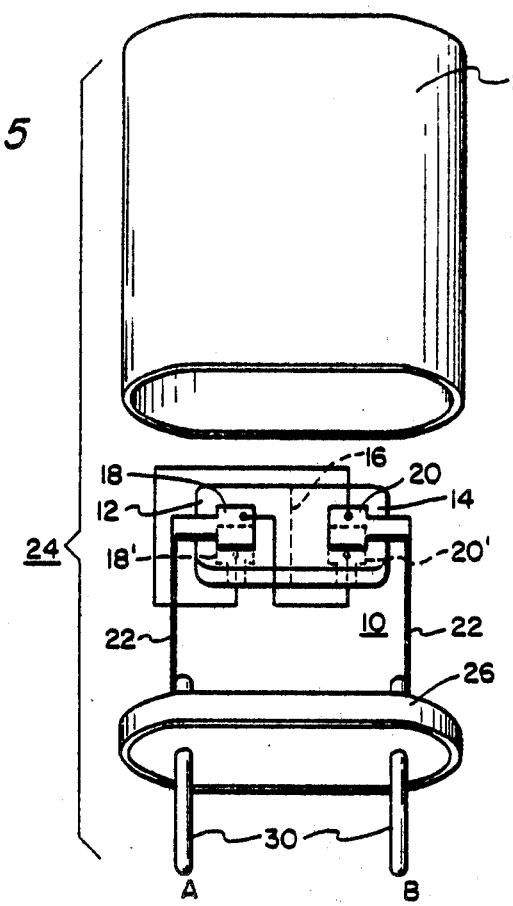
Figure 6:
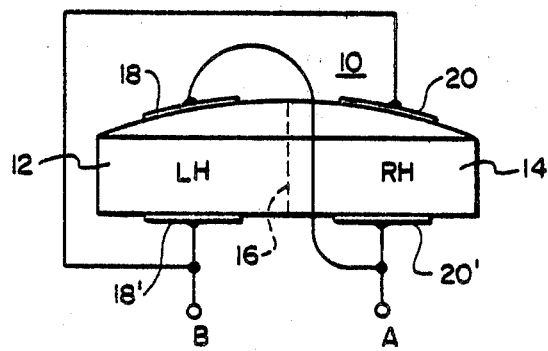

FIG. V shows a suitable metal enclosure for hermetically sealing the resonators shown in FIGS. 1 through 4.

FIG. VI shows a cross sectional view of a plano-convex resonator plate that can be used in the invention.

Referring to FIG. I to FIG. IV, the resonator plate 10 is optically twinned into a left-handed (LH) portion 12 and a right-handed (RH) portion 14; the two portions being separated by twin boundary 16. A pair of electrodes including an upper electrode 18 and a lower electrode 18' is deposited onto the (LH) portion 12 and another pair of electrodes including an upper electrode 20 and a lower electrode 20' are deposited onto the (RH) portion 14. The pairs of electrodes are interconnected to each other and to oscillator circuitry designated A and B.

Other modifications are seen as coming within the scope of the invention. For example, instead of the rectangular electrodes as shown in the drawing, circular electrodes may be used. Similarly, the resonator plate may be square or rectangular.

The invention herein is significant in that optical twins are normally undesirable in resonator plates. That is, when a single electrode is deposited over both regions, the two portions of the plate vibrate out of phase. In this invention, however, because two resonators are involved, the out of phase vibration can be readily avoided.

It should be noted that most pieces of quartz found in nature have twinned areas. Optical twins are usually small, and are separated by straight line boundaries that are parallel to the natural faces. One may have to search through a large number of twinned pieces of quartz before suitable twinned pieces can be found. This, however, is not a major problem as the pieces that are eventually selected can be used for seeds to grow large pieces of suitable twinned cultured quartz. One may even create, artificially, such twinned seeds by "welding" together left-handed and right-handed pieces of quartz. That is, if the mating surfaces of the two pieces are optically flat and nearly atomically clean, then when the pieces are pressed together in ultrahigh vacuum, they weld together. Other, more standard methods of joining the two pieces may also be employed.

The resonator as made by the method of this invention is monolithic and easy to fabricate. It has the additional advantage of assurance that if the seeds are chosen properly, then the two resonators have the same angle of cut and thus the same frequency versus temperature characteristics. The other properties of the resonator are also likely to be nearly identical because the two halves are likely to have nearly the same impurity and defect concentrations.

As an alternative to the method described for growing suitable twinned pieces of cultured quartz, one may form the twins in the following manner:

Suitable oriented pieces of quartz, one right-handed and the other left-handed, are placed in proximity to each other in an autoclave and the growth that takes place on piece-right and piece-left gradually makes the two pieces grow into a single piece with well-defined boundary. This method, which also takes place in nature in a more chaotic fashion, allows one to orient the right- and left-handed pieces so that their respective axes are anti-parallel. This yields complete immunity to acceleration effects, whereas the joining of Brazil twins as found in nature leaves the Z (or c) axes parallel, and the Y (or b) axes parallel, so that compensation takes place only for the X (or a) axis.

The resulting twinned pieces of quartz, made as described above, are suitable for monolithic coupled resonators and filters as well as ordinary resonators.

We wish it to be understood that we do not desire to be limited to the exact details as described for obvious modifications will occur to a person skilled in the art.

What is claimed is:

1. Method of making acceleration resistant resonators from a single quartz plate that is optically twinned into a left-handed (LH) quartz portion and a right-handed (RH) quartz portion, said method including the steps of
   (A) forming a resonator plate such that the effective thickness of the (LH) portion is substantially the same as the effective thickness of the (RH) portion,
   (B) mounting and bonding the resonator plate to be support structure of a crystal resonator enclosure,
   (C) depositing a pair of electrodes onto the (LH) portion and a pair of electrodes onto the (RH) portion,
   (D) adjusting the thicknesses of the two pairs of electrodes so that the resonant frequency of the resonator on the (LH) portion is substantially the same as the resonant frequency of the resonator on the (RH) portion,
   (E) interconnecting the pairs of electrodes to each other and to an oscillator circuit so that in-phase vibration of the two portions is assured, and
   (F) hermetically sealing the enclosure.

2. Method according to claim 1 wherein the optically twinned piece of quartz from which the resonator plate is formed is natural quartz.

3. Method according to claim 1 wherein the optically twinned piece of quartz from which the resonator plate is formed is artificially formed.

4. Method according to claim 3 wherein the optically twinned piece of quartz is formed by pressing together in ultra-high vacuum optically flat and nearly atomically clean (LH) and (RH) seeds, and using the seed so formed to grow large pieces of suitably twinned cultured quartz.

5. Method according to claim 1 wherein the resonator is made plano-plano.

6. Method according to claim 1 wherein the resonator plate is made plano-convex.

7. Method according to claim 1 wherein the resonator plate is made biconvex.

8. Method according to claim 1 wherein the pairs of electrodes are interconnected in parallel to each other and to an oscillator circuit.

9. Method according to claim 1 wherein the pairs of electrodes are interconnected in series to each other and to an oscillator circuit.

10. Method of making acceleration resistant resonators from a single artificially formed quartz plate that is optically twinned into a left-handed (LH) quartz portion and a right-handed (RH) quartz portion, said method consisting of forming a plano-plano resonator plate, mounting and bonding the resonator plate to the support structure of a crystal resonator enclosure, depositing a pair of electrodes onto the (LH) portion and a pair of electrodes onto the (RH) portion, adjusting the thicknesses of the two pairs of electrodes so that the resonant frequency of the resonator on the (LH) portion is substantially the same as the resonant frequency of the resonator on the (RH) portion, interconnecting the pairs of electrodes to each other and to an oscillator circuit in series so that in-phase vibration of the two portions is assured, and hermetically sealing the enclosure.

* * * * *